United States Patent [19]
Yamada et al.

[11] Patent Number: 5,449,915
[45] Date of Patent: Sep. 12, 1995

[54] ELECTRON BEAM EXPOSURE SYSTEM CAPABLE OF DETECTING FAILURE OF EXPOSURE

[75] Inventors: Akio Yamada; Yoshihisa Oae, both of Kawasaki, Japan

[73] Assignee: Fujitsu Limited, Kawasaki, Japan

[21] Appl. No.: 215,828

[22] Filed: Mar. 22, 1994

[30] Foreign Application Priority Data

Jun. 24, 1993 [JP]  Japan .................. 5-153776

[51] Int. Cl.⁶ .................. H01J 29/70; H01J 29/96; B23K 15/08
[52] U.S. Cl. .................. 250/397; 250/492.2; 250/398; 219/121.23; 219/121.28
[58] Field of Search .................. 219/121.23, 121.25, 219/121.26, 121.28, 121.29, 121.3; 250/396 R, 397, 398, 396 ML, 492.2, 492.22, 492.3; 430/5, 296; 156/627, 643; 315/134

[56] References Cited

U.S. PATENT DOCUMENTS

| | | | |
|---|---|---|---|
| 4,568,861 | 2/1986 | Doran et al. | 250/397 |
| 4,937,458 | 6/1990 | Fujkura | 250/492.2 |
| 5,148,033 | 9/1992 | Yamada et al. | 250/492.2 |
| 5,283,440 | 2/1994 | Sohda et al. | 250/492.2 |

FOREIGN PATENT DOCUMENTS

| | | |
|---|---|---|
| 57-95629 | 6/1982 | Japan . |
| 57-112026 | 7/1982 | Japan . |
| 1-102930 | 4/1989 | Japan . |

Primary Examiner—Geoffrey S. Evans
Assistant Examiner—Gregory L. Mills
Attorney, Agent, or Firm—Armstrong, Westerman, Hattori, McLeland & Naughton

[57] ABSTRACT

An electron beam exposure system includes an electron beam shaping mask having a plurality of apertures for shaping an electron beam, a blanking plate disposed between the electron beam shaping mask and an object for inhibiting the passage of the electron beam deviated from a predetermined optical axis, a current adding circuit supplied with a first current induced in the electron beam shaping mask as a result of capturing of the electron beam and a second current induced in the blanking plate as a result of capturing of the electron beam for generating a third current as a sum of the first and second currents, a current/voltage converter for generating a first pulse signal in response to the third current, a first counter supplied with the first pulse signals for counting the first pulse signals and outputting a first count value, a second counting circuit supplied with a second pulse signal corresponding to the driving signal, for counting the second pulse signals and generating a second count value representing the count result, and a comparator supplied with the first and second count values for comparing the first count value with the second count value. The comparator issues an alarm indicating the failure of exposure on the basis of the result of comparison.

8 Claims, 8 Drawing Sheets

ELECTRON BEAM EXPOSURE SYSTEM CAPABLE OF DETECTING FAILURE OF EXPOSURE

BACKGROUND OF THE INVENTION

1. Field of the Invention

The present invention generally relates to fabrication of semiconductor devices and more particularly to an electron beam exposure system and method for exposing semiconductor patterns by a charged particle beam such as an electron beam on an object such as a semiconductor wafer.

2. Description of the Related Arts

Electron beam lithography is an indispensable technology for producing advanced semiconductor integrated circuits having a large integration density. With electron beam lithography, it is possible to expose patterns having widths below 0.05 μm with an alignment error below 0.02 μm. Accordingly, electron beam lithography is considered to play a vital role in the production of future semiconductor devices such as DRAMs having a memory capacity exceeding 256 Mbits.

In the production of semiconductor devices by electron beam lithography, the throughput of the production is very important in addition to the resolution of device patterns. Since the exposure is effected using a single converged electron beam in the case of electron beam lithography, electron beam lithography is more disadvantageous in this respect than a conventional optical exposure method which can exposure the entire device pattern in a single shot. However, the resolution by the conventional optical expose system has nearly reached the limit, and for this reason, the electron beam exposure process has to be used for the production of future high speed semiconductor devices or large memory capacity semiconductor memories.

Under such a situation, various attempts have so far been made in order to improve the throughput of the electron beam exposure. For example, the inventor of the present invention previously proposed so-called "block exposure process" and "BAA exposure process." In the block exposure process, a device pattern is divided into a number of basic patterns, and the electron beam is shaped in accordance with such basic patterns. The block exposure method has successfully attained a throughput of about 1 cm$^2$/sec at present. By the BAA exposure method, on the other hand, a single electron beam is divided into a large number of electron beam elements arranged in rows and columns, and a large number of exposure dots are formed on a substrate in accordance with the exposure pattern by turning on and off the individual electron beam elements. By the BAA exposure process, it is possible to expose, at a high speed, an exposure pattern having a complicated shape on a substrate.

Figure 1:
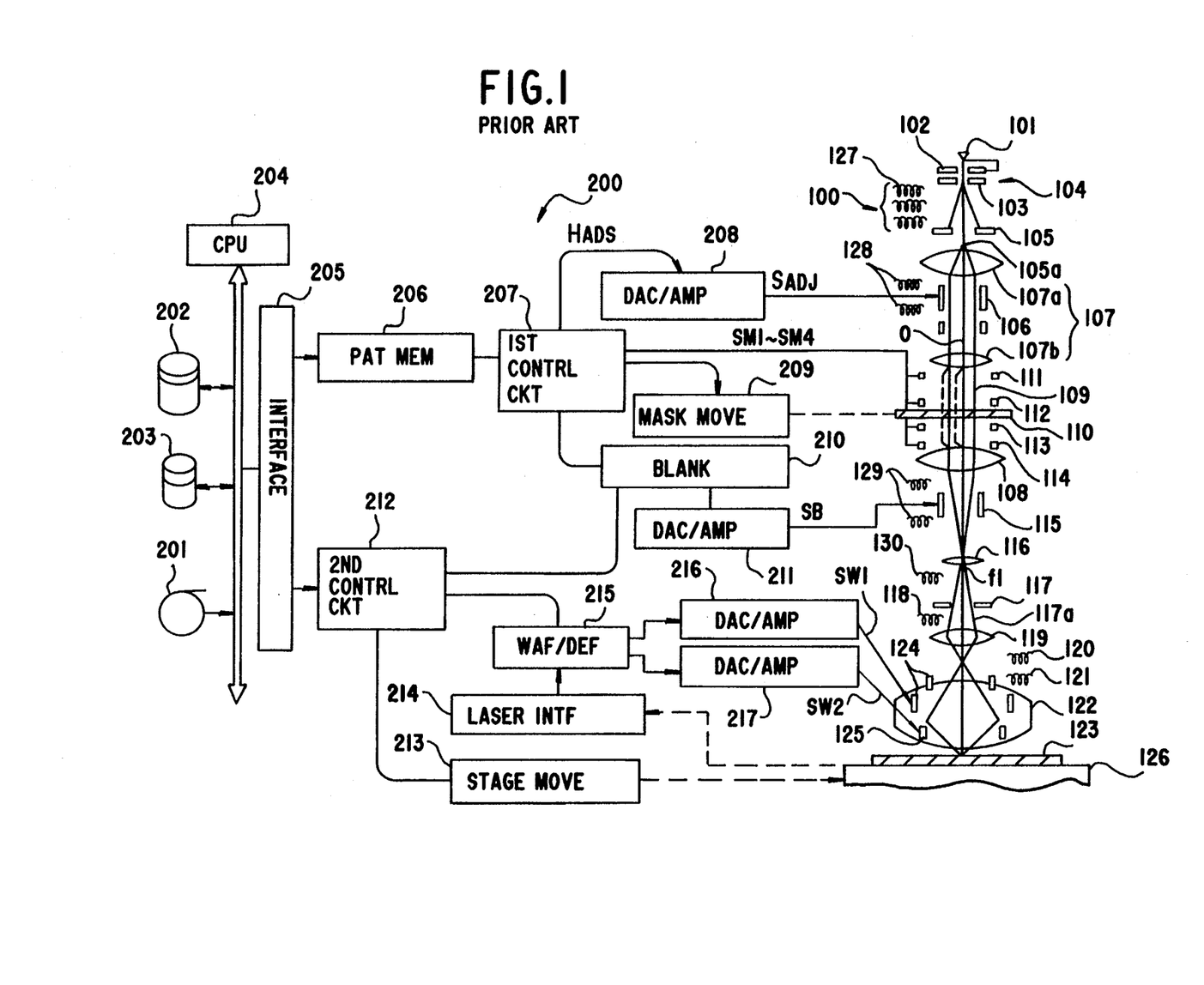
FIG. 1 is a diagram showing the overall construction of a conventional electron beam exposure system.

FIG. 1 is a schematic diagram of a conventional electron beam exposure system that employs the block exposure process.

Referring to FIG. 1, the electron beam exposure system generally comprises an electron optical system 100 for producing a focused electron beam and a control system 200 for controlling the electron optical system 100. The electron optical system 100 includes an electron gun 104 as an electron beam source, wherein the electron gun 104 includes a cathode 101, a grid 102 and an anode 103, and emits an electron beam as a diverging electron beam along a predetermined optical axis.

The electron beam formed produced by the electron gun 104 is passed through a beam shaping aperture 105a provided in an aperture plate 105 for beam shaping. The aperture 105a is formed in alignment with the optical axis O and shapes the incident electron beam into a rectangular sectional shape upon passage therethrough.

Figure 2A:
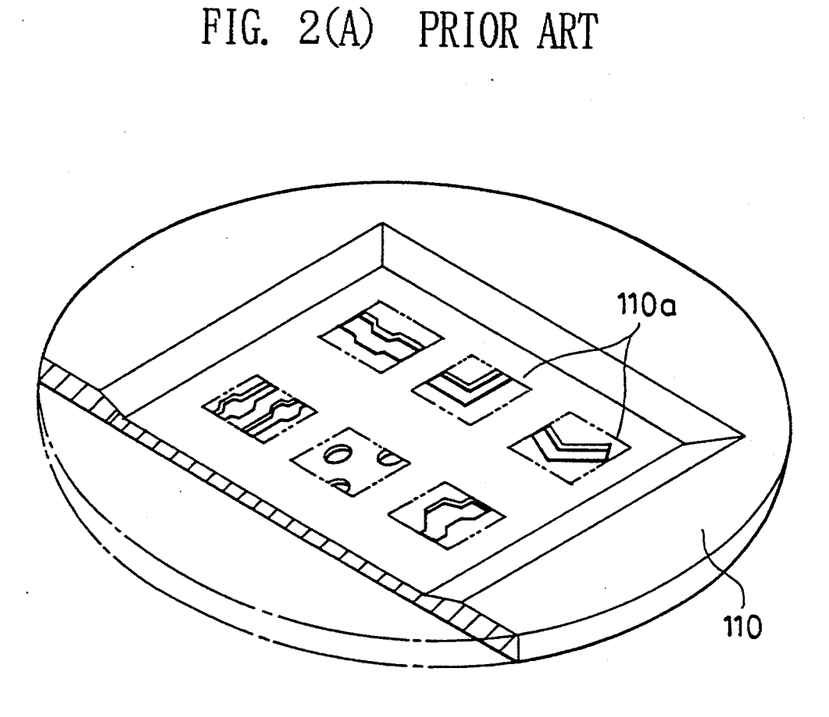
FIGS. 2(A) and 2(B) are diagrams showing the construction of a beam shaping mask used in the electron beam exposure system shown in FIG. 1.
Figure 2B:
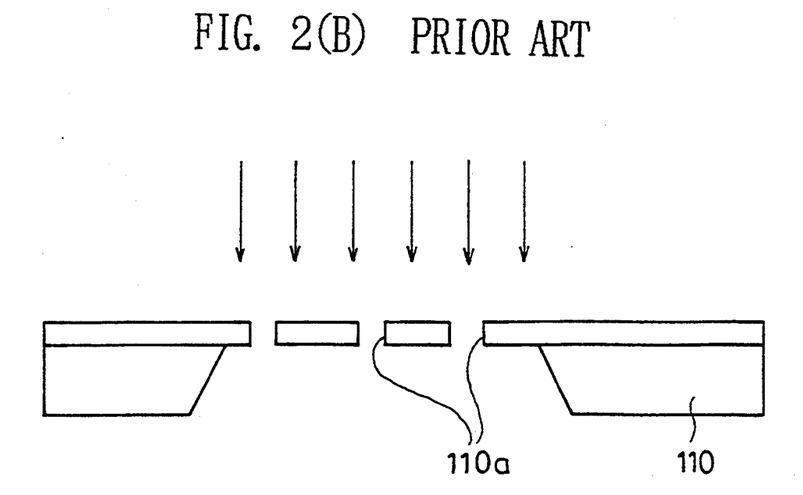

The electron beam thus shaped is converted to a parallel electron beam by an electron lens 107 having a focal point at the aperture 105a, and is further focused on a block mask 110 by the electron lens 107b. Thereby, the lens 107b projects the image of the rectangular aperture described above on the block mask 110. As shown in FIGS. 2(A) and 2(B), a large number of apertures 110a corresponding to the basic patterns of the semiconductor devices to be exposed, are formed in the block mask 110, and each of these apertures shapes the electron beam in accordance with the shape thereof.

In the system of FIG. 1, deflectors 111, 112, 113 and 114 are provided so as to select a desired aperture by deflecting the electron beam. Here, the deflector 111 is activated by a control signal SM1 and deflects the electron beam away from the optical axis O, whereas the deflector 112 is activated by a control signal SM2 and deflects the electron beam in an opposite way such that the beam travels in parallel with the optical axis. After passing through the block mask 110, the electron beam is so deflected toward the optical axis O by the deflector 113 activated by a control signal SM3, and the electron beam is further deflected by the deflector 114 activated by a control signal SM4 in such a manner as to travel along the optical axis O. Further, the block mask 110 itself is disposed movably in the direction perpendicular to the optical axis O, so that any one of the beam shaping apertures can be selected over the entire surface of the block mask 110.

After passing through the block mask 110, the electron beam passes through lenses 108 and 116 acting as a demagnifying optical system and is converged on a focal point f$_1$ on the optical axis O to form the image of the selected aperture on the focal point f$_1$. The electron beam thus converged passes through a blanking aperture 117a formed in a blanking plate 117 and is then focused on a substrate supported on a movable stage 126 by electron lenses 119, 122 that constitute another demagnifying optical system. The electron lens 122 functions as an objective lens, and includes various correcting coils 120, 121 for correcting focus and aberration as well as deflectors 124, 125 for moving the converged electron beam over the surface of the substrate.

To control the exposure operation, the electron beam exposure system shown in FIG. 1 uses a control system 200. The control system 200 includes storage devices such as a magnetic tape device 201, magnetic disks 202, 203, and so forth, for storing exposure data relating to device patterns of semiconductor devices that are to be exposed. In the case of the example shown, the magnetic tape 201 is used for storing various design parameters, the magnetic disk 202, for storing exposure patterns.

The data stored in the storage devices are read out by a CPU 204 and then transferred to an interface 205 after data decompression. The data stored in the data memory 206 is transferred to a first control unit 207 for generating the control signals SM1 to SM4 described above, and the control unit 207 supplies the data to the deflectors 111 to 114. Further, the control unit 207 generates control signals sent to a mask moving mechanism 209, and the mask moving mechanism 209 moves the block mask perpendicularly to the optical axis O in response to the control signal. Thus, a desired aperture on the mask 110 can be selected by deflecting the electron beam by the deflectors 111 to 114 and further moving the block mask 110 laterally.

Further, the first control unit 207 sends control signals to a blanking controller 210, wherein the blanking controller 210 generates a blanking signal for interrupting the irradiation with the electron beam in response thereto. Next, the blanking signal is converted to an analog signal SB by a D/A converter 211, and the analog signal SB controls the deflector 115 in such a manner that the electron beam deflects away from the optical axis O. As a result, the electron beam is off the blanking aperture 117a and does not reach the surface of the substrate 123.

The control unit 207 further generates pattern correction data $H_{ADJ}$ and sends the same to a D/A convertor 208, wherein the D/A convertor 208 generates a control signal $S_{ADJ}$ in response to the pattern correction data $H_{ADJ}$ and supplies the control signal $S_{ADJ}$ thus produces to a deflector 106 that is interposed between the electron lenses 107a, 107b. Thereby, the shape of the electron beam passing through the aperture of the mask 110 can be changed. The latter function is used in the case where a desired electron beam shape is different from the shape obtained by the aperture on the block mask 110.

The interface 205 further extracts data for controlling the movement of the electron beam over the surface of the substrate 123 and supplies the data to a second control unit 212. Receiving the data, the second control unit 212 generates a control signal for deflecting the electron beam over the surface of the substrate 123 and supplies the resultant control signal to a wafer deflection control unit 215. The wafer deflection control unit 215, in turn, generates a deflection control signal according to the control signal supplied thereto and supplies the deflection control signal to D/A convertors 216 and 217. The D/A convertors 216, 217 thereby generate driving signals SW1 and SW2 for driving deflectors in accordance with the deflection control signals respectively, and supply these signals to the deflectors 124, 125 for causing the deflection of the electron beam. Further, the position of a stage 126 is measured by a laser interferometer 214. Thereby, the wafer deflection control unit 215 changes the output deflection control signal and hence the driving signals SW1 and SW2, in accordance with the result of measurement of the stage position by the laser interferometer. Further, the second control unit 212 generates a control signal for moving the stage 216 horizontally.

FIG. 2(A) is a perspective view of the structure of the mask 110. It will be seen that a large number of apertures 110a are formed on the mask 110 in accordance with basic patterns. When the electron beam is to passed through one of these masks 110a as shown in FIG. 2(B), the electron beam is shaped in accordance with the shape of the selected aperture 110a, and the electron beam thus shaped is projected onto the substrate 123. In the exposure system shown in FIG. 1, the exposure is turned on and off in the form of shot in accordance with the blanking signal supplied to the electrostatic deflector 115, and one of the apertures 110a on the mask 110 is selected and exposed in each shot.

Figure 3:
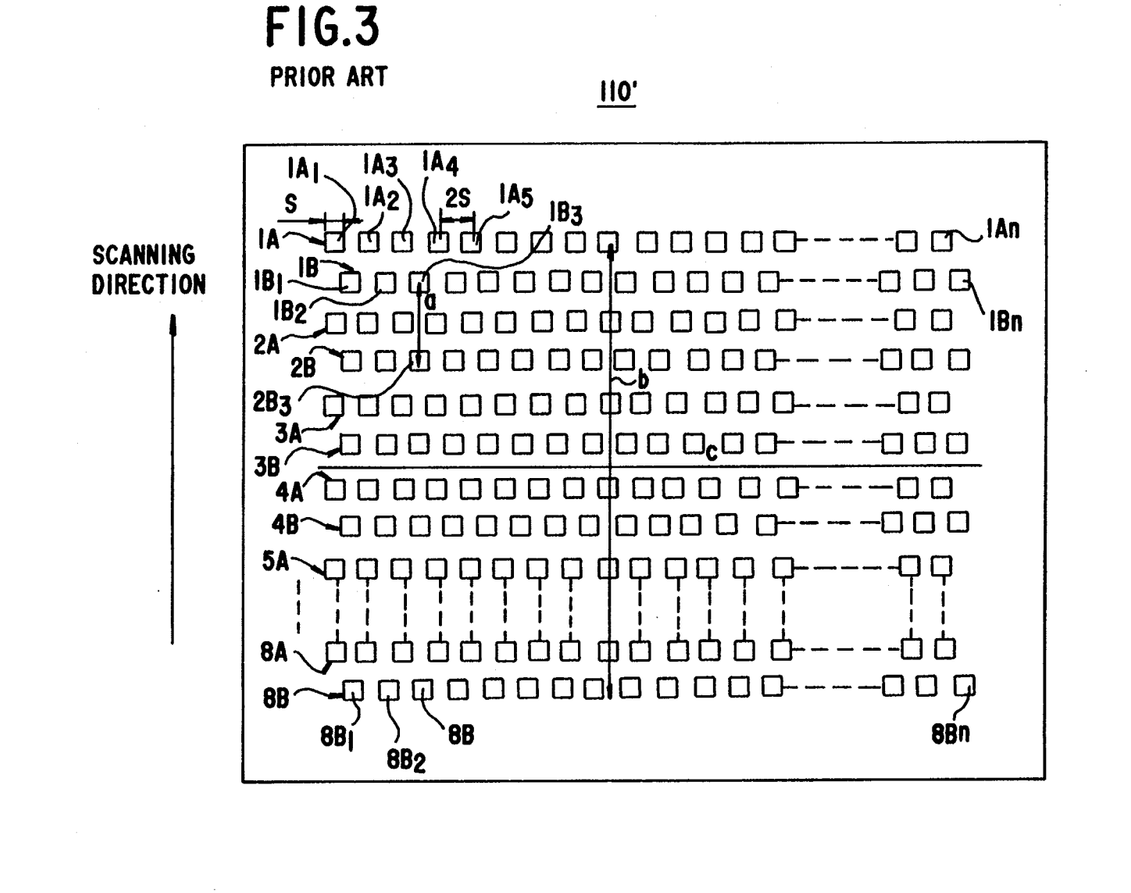
FIG. 3 is a diagram showing the construction of another beam shaping mask used in the electron beam exposure system shown in FIG. 1.

FIG. 3 shows an example of a BAA mask 110' used for BAA exposure.

Referring to FIG. 3, the mask 110' is used in the system shown in FIG. 1 in place of the mask 110, and a large number of very small apertures $1A_1, 1A_2, 1A_3, \ldots$ are formed in rows and columns. Further, an electrostatic deflector is provided to each aperture. When actuated, each electrostatic deflector deflects the electron beam passing through the corresponding aperture, and as a result, a large number of electron beam elements arranged in rows and columns are formed from the single electron beam generated by the electron gun 104, and an arrangement of exposure dots corresponding to the electron beam elements passing through the apertures of FIG. 3 is projected onto the substrate 123 shown in FIG. 1. When the mask 110' shown in FIG. 3 is used, an arbitrary exposure pattern can be exposed at a high speed on the substrate in the form of shots corresponding to the blanking signals, in the same way as in the case of the block exposure.

In the electron beam exposure system shown in FIG. 1, it should be noted that skip or blur of shot should not occur in each of the shots, whether the exposure is the block exposure or the BAA exposure. On the other hand, it should be noted that the region that is exposed on the substrate in one single shot of the electron beam generally has a size of several microns, and the exposure is executed at a rate of about 200 nsec per region. This means that the exposure clock corresponding to the blanking signal has a frequency of at least 5 MHz, and the total number of shots per substrate exceeds 1 G shots. Since the exposure is carried out under such an extremely stringent condition, it is extremely difficult to completely prevent the occurrence of skips of shot and blur due to erroneous operation of the controllers, discharge of high voltage portions, charge-up of a vacuum column which accommodates the electron optical system, external noise, and so forth. Particularly when the electron beam deforms on the upstream side of the round aperture 117a on the optical axis, the electron beam is cut off by the aperture plate 117 and does not reach the substrate, or the intensity of the electron beam drops even when it reaches the substrate, causing skips of shot or blur. In order to ensure the high reliability of the exposure, it is necessary to inspect the exposure pattern by an inspection instrument such as an optical microscope or an electron microscope, but such inspection is extremely difficult in the case of integrated circuit of a large integration density.

To solve the problem of defective exposure, the Japanese Patent Laid-Open No. 102930/1989 teaches a construction that measures a current corresponding to the electron beam being cut off by the round aperture plate 117 and calculates the number of the shots on the basis of the measured current value. The prior art further compares the value obtained with the number of the shots calculated from the exposure clock or the blanking signal and detects the failure of exposure when there are any differences detected therebetween.

Figure 4:
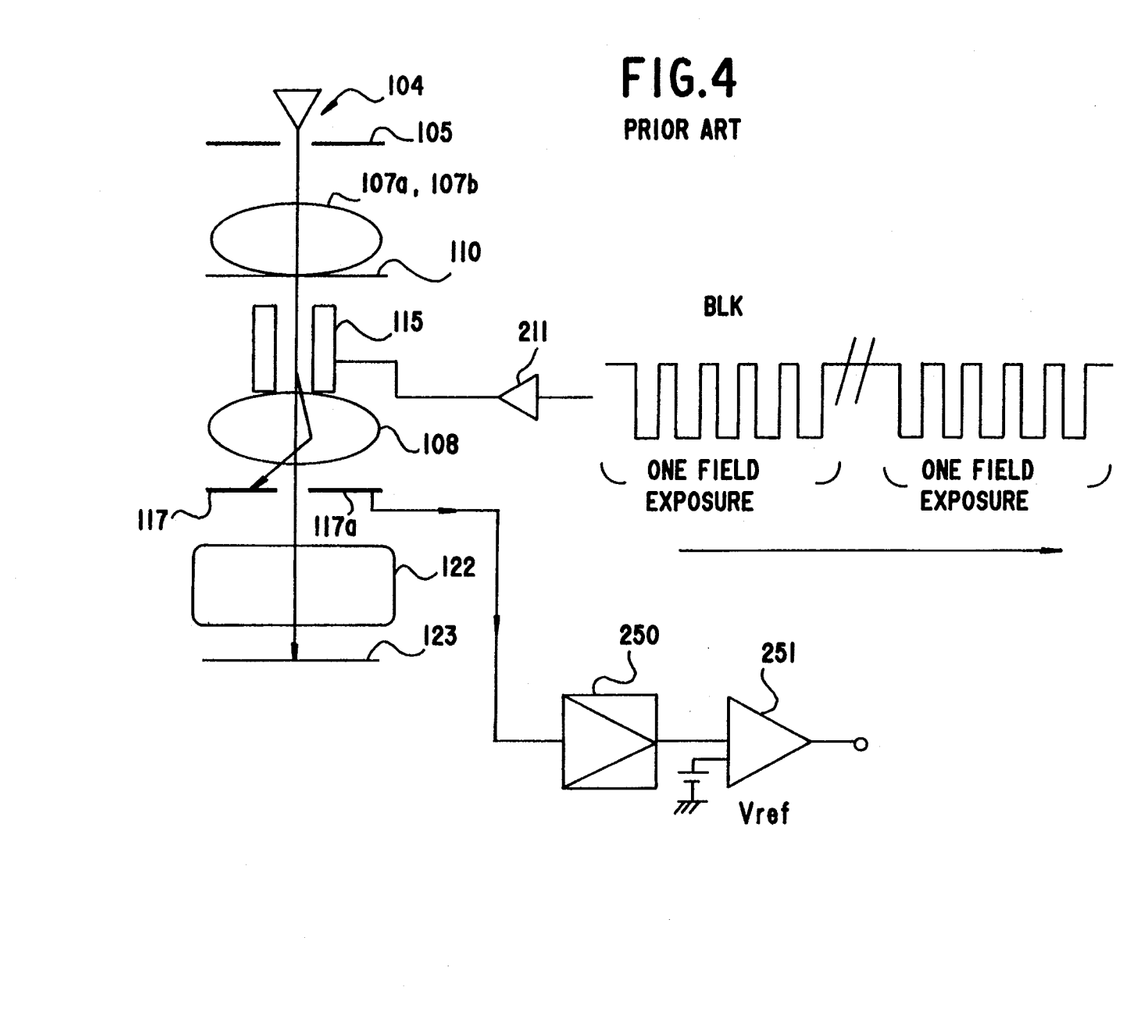
FIG. 4 is a diagram showing the construction of a conventional electron beam exposure system in which skip of shot and blur of electron beam are detected.

FIG. 4 shows an example where the structure described above is applied to the electron beam exposure system of FIG. 1. In the construction shown, a current generated as a result of the irradiation of the electron beam on the blanking plate 117 is amplified by an amplifier 250, and the resultant output voltage is compared by a comparator 251 with a predetermined reference voltage. The reference voltage is set so that an output pulse signal is produced when the interruption of the electron beam by the blanking plate 117 is complete. Accordingly, when a shot is completely conducted, a pulse signal that corresponds to the blanking signal in one to one relationship is obtained from the comparator 251. When one or more of the shots is incomplete, on the other hand, the output pulse signal from the comparator 251 differs from the blanking signal, and such a difference can be detected by comparing the number of the pulses of the blanking signal with the number of output pulses of the comparator 251.

Figure 5:
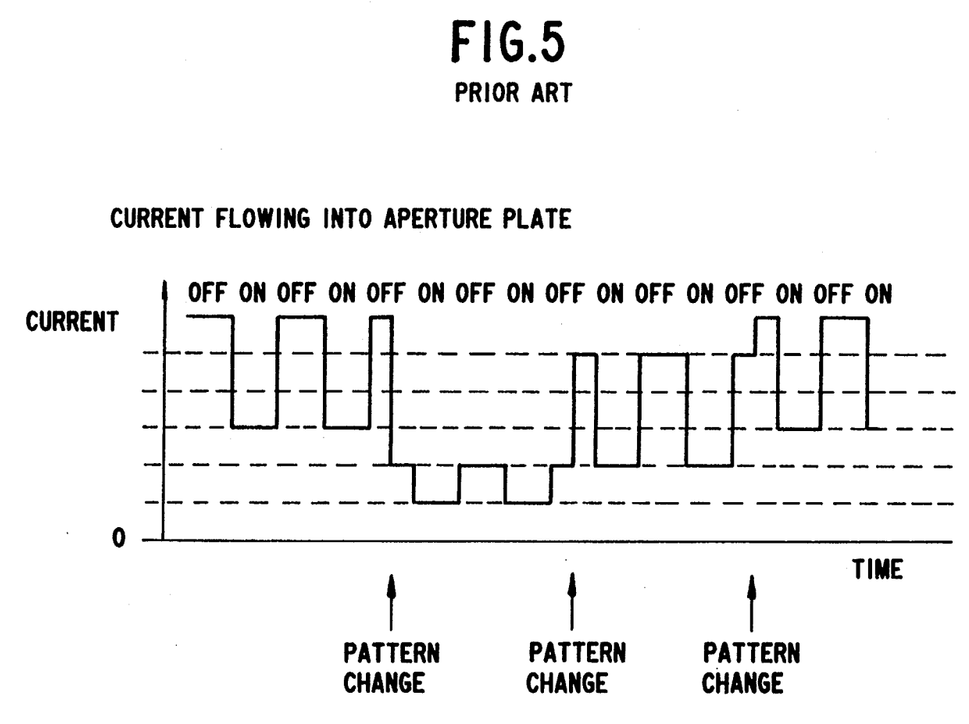
FIG. 5 is a diagram showing the operation of the system shown in FIG. 4.

When such a conventional construction is applied to the electron beam exposure system shown in FIG. 1 that uses the block mask 110 or the BAA mask 110', there occurs the following problem. Because the exposure pattern to be exposed is different in each shot, the amount of the electron beam current cut off by the round aperture 117 changes variously in each shot as shown in FIG. 5 even though the exposure is ideally executed and skip of shot and blur of the shots do not exist at all. Thereby, the detection of the shots by the comparator 251 becomes substantially impossible. In other words, the conventional construction described in the aforementioned reference, i.e. Japanese Patent Laid-Open No. 102930/1989, cannot be applied to the electron beam exposure system for effecting the block exposure or BAA exposure process.

On the other hand, it may be possible in principle to detect the actual number of shots by detecting the current flowing through the substrate 123 and to detect skip of shot and blur by comparing this number with the number of times of the shots obtained from the blanking signals. However, the substrate 123 has a substantial stray capacitance and the capacitance value and its resistance value, too, change with the condition under which the substrate is held. When the need of detecting high speed pulse signals of over hundreds of mega-Hertz are taken into consideration, this method is not practical.

SUMMARY OF THE INVENTION

Accordingly, it is a general object of the present invention to provide a novel and useful electron beam exposure system wherein the problems described above is eliminated.

Another and more specific object of the present invention to provide an electron beam exposure system which can reliably detect skip of shot and blur of electron beam.

Another object of the present invention is to provide an electron beam exposure system comprising:
an electron beam source for emitting an electron beam and directing the same to an object to be exposed along a predetermined optical axis;
converging means for converging the electron beam on the object;
deflecting means for deflecting the electron beam with respect to the optical axis for causing a scanning of the electron beam over the object;
an electron beam shaping mask disposed between the electron beam source and the object on the optical axis, said electron beam shaping mask having a plurality of apertures for shaping the electron beam by a plurality of the apertures and forming a shaped electron beam corresponding to one of exposure patterns of which image is to be formed on the object;
a blanking plate disposed between the electron beam shaping mask and the object on the optical axis, said blanking plate having an electron beam path formed in alignment with the optical axis for inhibiting the passage of the electron beam deviated from the optical axis;
an electrostatic deflector disposed between the blanking plate and the electron beam source along the optical axis so as to deflect the electron beam from the optical axis according to driving pulse signals applied thereto;
current adding means supplied with a first current induced in the electron beam shaping mask as a result of capturing of the electron beam by the electron beam shaping mask and a second current induced in the blanking plate as a result of capturing of the electron beam by the blanking plate, for generating a third current whose value is a sum of the first and second currents;
current/voltage converting means for generating a first pulse signal in response to the third current outputted from the current addition means;
first counting means supplied with the first pulse signals from the current-voltage converting means, for counting the first pulse signals and outputting a first count value representing the result of counting;
second counting means supplied with a second pulse signal corresponding to the driving signal, for counting the second pulse signals and generating a second count value representing the count result; and
comparing means supplied with the first and second count values, for comparing the first count value with the second count value, said comparing means issuing an alarm indicating the failure of exposure on the basis of the result of comparison.

Another object of the present invention is to provide an electron beam exposure method comprising the steps of:
shaping an electron beam in conformity with a desired pattern by passing the electron beam through a mask;
repeatedly turning on and off the shaped electron beam by passing said electron beam through a cut-off plate having apertures; and
exposing a pattern on an object to be exposed while the electron beam is turned on;
determining the sum of a first current generated in the cut-off plate while the electron beam is cut off by the cut-off plate and a second current generated in the mask when the electron beam is shaped by the mask;
producing an output signal representing a sum of said first and second currents respectively in correspondence to a state wherein the electron beam is turned on and a state wherein the electron beam is turned off;
producing an output pulse when the output signal for a state in which the electron beam is turned on, has a level lower than, by a predetermined threshold, the output signal for a state wherein the electron beam is turned off;
counting the output pulses; and
issuing an alarm by detecting a discrepancy between a count value of the output pulses and the number of times of actual exposures.

Another object of the present invention is to provide an electron beam exposure system comprising:

an electron beam source for emitting an electron beam and directing the electron beam to an object to be exposed along a predetermined optical axis;

converging means for converging the electron beam on the object;

deflecting means for deflecting the electron beam with respect to the optical axis to cause a scanning of the electron beam over the object;

an electron beam shaping mask disposed between the electron beam source and the object on the optical axis, said electron beam shaping mask having a plurality of apertures so as to shape the electron beam by a plurality of apertures and emitting a shaped electron beam corresponding to one of exposure patterns of which image is to be exposed on the object;

a blanking plate disposed between the electron beam shaping mask and the object on the optical axis, said blanking plate having an electron beam path formed in alignment with the optical axis and inhibiting the passage of the electron beam deviated from the optical axis;

an electrostatic deflector disposed between the blanking plate and the electron beam source along the optical axis so as to deflect the electron beam from the optical axis according to driving pulse signals supplied thereto;

electron detecting means for detecting electrons emitted from the object when the object is irradiated with the electron beams;

first counting means supplied with output pulses from the electron detecting means in response to the detection of electrons, as first pulse signals, said first counting means counting the first output pulses and outputs a first count value representing the result of counting;

second counting means supplied with second pulse signals in response to the driving signals, said second counting means counting the second pulse signals for outputting a second count value representing the count result; and comparing means supplied with the first count value and the second count value for comparing the first count value with the second count value, said comparing means issuing an alarm indicating a failure in the exposure, based upon the result of the comparison.

According to the first and second features of the present invention, a third current produced by the current adding means corresponds to the total current caused by the electron beam that has been emitted from the electron beam source under the state where the converged electron beam is turned off by the electrostatic deflector. Thus, the level of the third current is always held constant irrespective of the patterns projected on the object. Therefore, the number of times the actual exposures has been made on the object can be reliably detected in both the block exposure and BAA exposure processes by monitoring the variation of the third current with respect to the peak, reference value of the third current. Whether or not exposure is completely made can be judged by comparing the number of times of the actual exposures determined in this way with the total number of the driving pulses supplied to the electrostatic deflector.

By the third feature of the present invention, low energy electrons such as reflected electrons that are emitted from the object because of the irradiation with the electron beam are detected by the electron detecting means having a high operational speed. Therefore, whether or not the exposure is completely made can be judged by comparing the number of times of the actual exposures thus detected with the total number of the driving pulses supplied to the electrostatic deflector.

Other features and advantages of the present invention will become more apparent from the following detailed description of embodiments of the invention.

BRIEF DESCRIPTION OF THE DRAWINGS

FIGS. 7 (A) to 7(D) are diagrams for explaining the operation of the system shown in FIG. 6.

DETAILED DESCRIPTION OF PREFERRED EMBODIMENTS

Figure 6:
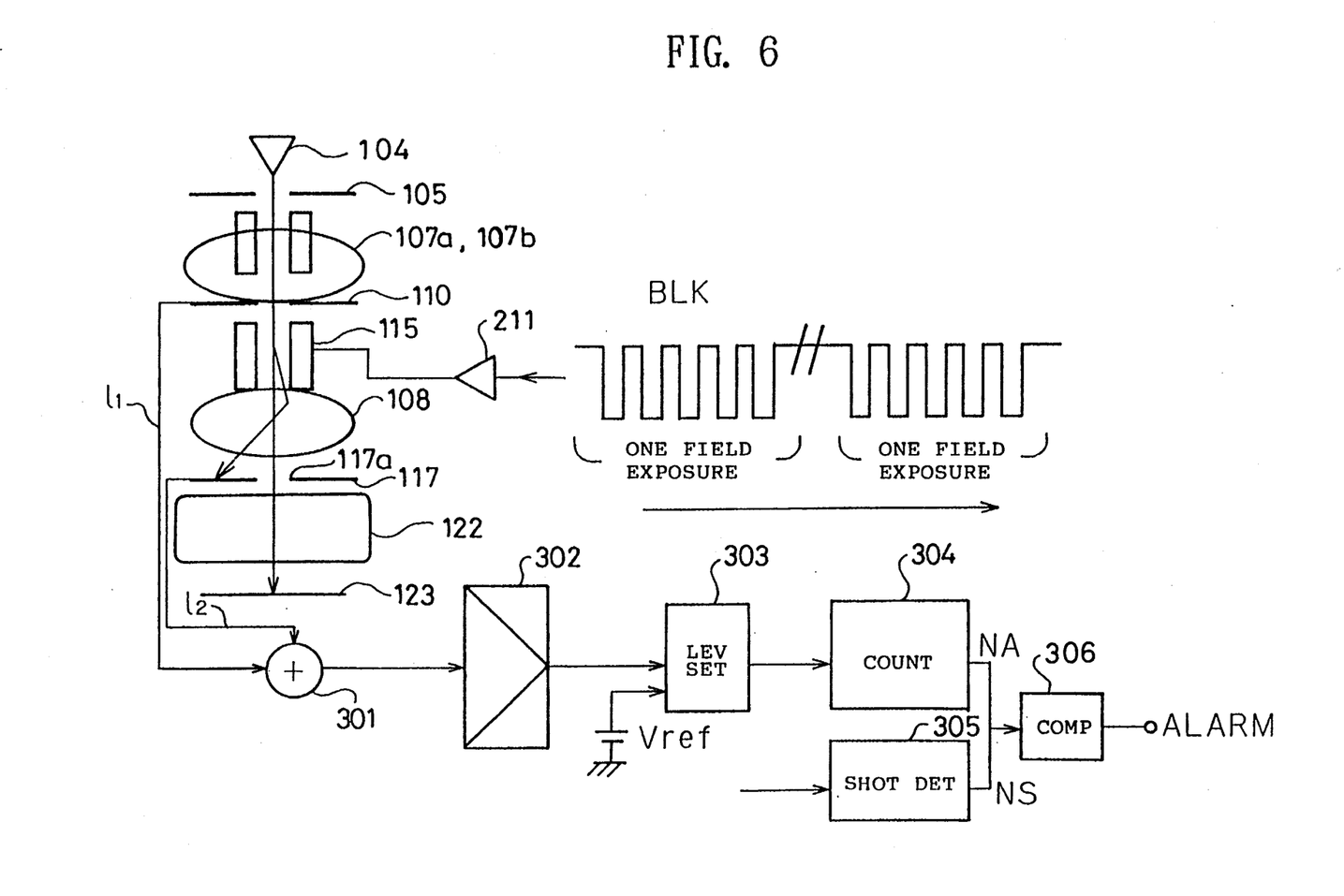
FIG. 6 is a diagram showing the construction of an electron beam exposure system according to a first embodiment of the present invention.

FIG. 6 shows the construction of an electron beam exposure system of the first embodiment of the present invention. In the drawing, the constituent parts described previously with reference to FIG. 1 are designated by the same reference numerals and their description will be omitted.

Referring to FIG. 6, the blanking signal BLK shown in the drawing is supplied to the electrostatic deflector 115 for turning on and off an electron beam on the substrate 123 through the D/A convertor 211 in the same way as in FIG. 4. The electron beam is turned off at a high level state of the blanking signal and is turned on at a low level state thereof.

In the present embodiment, the current caused by the electron beam from the electron gun 104 being cut off by the mask 110 for a beam shaping, is detected and supplied from the mask 110 to a current adder 301 as a first current. The current that flows through the aperture plate 117 due to the electron beam being cut off by the round aperture plate 117 is supplied as the second current to the current adder 301, and is added to the first current from the mask 110. The current adder 301 may be a mere current node at which a line $l_1$ connected to the mask 110 and a line $l_2$ connected to the aperture plate 117 are connected with each other, and supplies the third current representing a sum of the first and second currents to a high impedance amplifier 302. This amplifier 302 generates an output voltage corresponding to the third current and supplies the same to a threshold detecting circuit 303. The threshold detection circuit 303 practically comprises an analog comparator, generates an output pulse signal by comparing the level of the output voltage of the amplifier 302 with a predetermined reference voltage, and supplies the output pulse signal to a first high speed counter 304. On the other hand, the counter 304 counts the output pulses, and outputs a count value NA representing the sum. This count value NA represents the number of times the actual exposures is achieved on the substrate by the electron beam.

The electron beam exposure system shown in FIG. 6 further includes a second high speed counter 305 to which the exposure clocks are supplied. The counter 305 counts the exposure clocks as a count value NS. Here, the exposure clock has the same frequency as that of the blanking signal supplied to the electrostatic deflector 115, and one-shot exposure is effected in correspondence with each exposure clock. For example, the exposure clock may be the blanking signal itself. Therefore, the count value NS represents the number of times of the exposures or shots to be made by the exposure system. If the exposure is carried out completely, therefore, the count value NA coincides with the count value NS. In other words, if the values NA and NS do not coincide with each other, it is assumed that skip of shot and blur of electron beam would have occurred in the exposure. To make such a judgment, the electron beam exposure system shown in FIG. 6 includes a digital comparator 306. The comparator 306 compares the count value NA with the count value NS, and outputs an alarm signal when non-coincidence is detected.

Figure 7A:
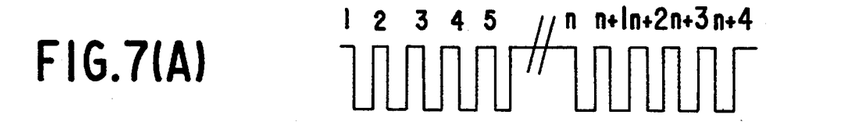
Figure 7B:
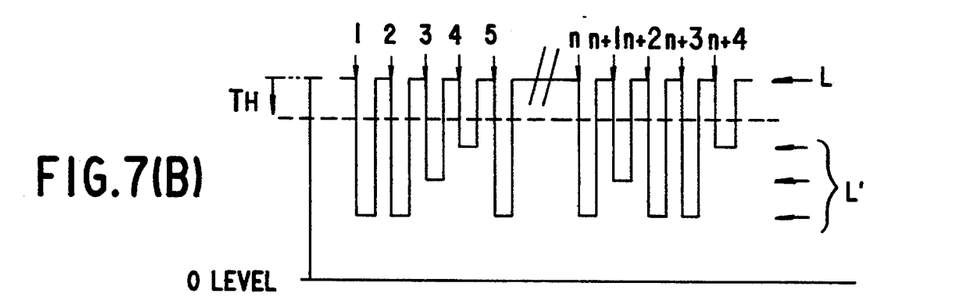
Figure 7C:
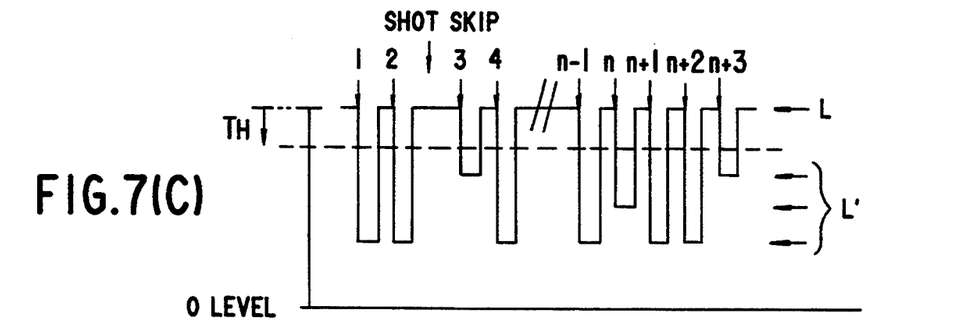
Figure 7D:
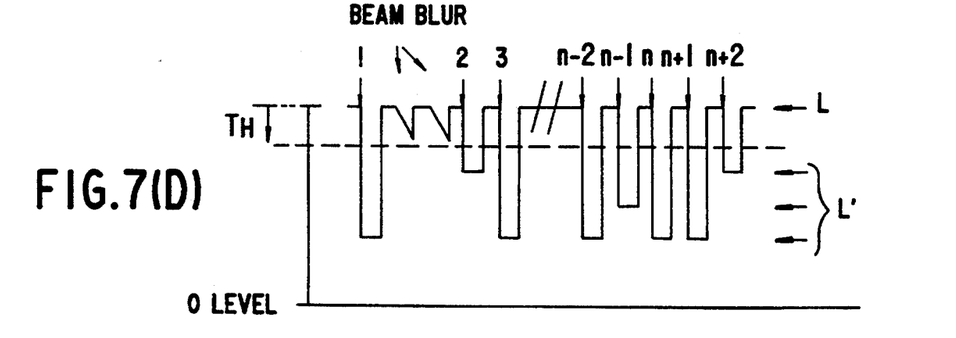

FIGS. 7(A) to 7(D) are timing charts showing the operation described above, wherein FIG. 7(A) shows the exposure clock BLK and FIG. 7(B) shows the output signal of the amplifier 302 when the exposure is completely carried out.

Referring to FIG. 7(A), the turn-off of the electron beam by the round aperture plate 117 occurs according to the high level state of the exposure clock BLK corresponding to the signal SB of FIG. 6, and the shot is effected by the supply of the low level of the signal BLK as shown in FIG. 7(B). As can be seen from FIG. 7(B), when the electron beam is turned off according to the exposure clock BLK, the whole quantity of the electron beam cut off by the round aperture plate 117 and the beam shaping mask 110 has a constant value at a level L irrespective of the patterns projected. When the shot is effected, on the other hand, cut-off of the electron beam by the round aperture plate 117 does not occur. In consequence, the output signal level L' of the amplifier 302 drops. In this case, even though exposure is carried out completely, the level L' changes in various ways in accordance with the exposure patterns.

On the other hand, when any skip of shot occurs as shown in FIG. 7(C), the output signal level of the amplifier 302 does not drop, though the exposure clock is supplied. Therefore, a skip of shot can be detected by detecting the output signal of the amplifier 302 by the threshold value detection circuit 303, in terms of a threshold value on the basis of a threshold value TH using the peak level L as the reference as shown in FIG. 7(C). More definitely, the detecting circuit 303 detects the pulses having levels below the threshold value TH shown in FIG. 4(C) and the total number NA of such pulses is counted by the counter 304. Thereby, the count value NA becomes smaller than the count value NS of the exposure clock BLK. Similarly, when blur of shot occurs as shown in FIG. 1(D), the total number NA of the pulses whose levels are below the threshold value TH becomes different from the total number NS of the exposure pulses. In this way, skip or blur can be detected by comparing the total number NA of the pulses with the total number NS of the pulses by the digital comparator 306.

Next, the second embodiment of the present invention will be described with reference to FIG. 8.

Figure 8:
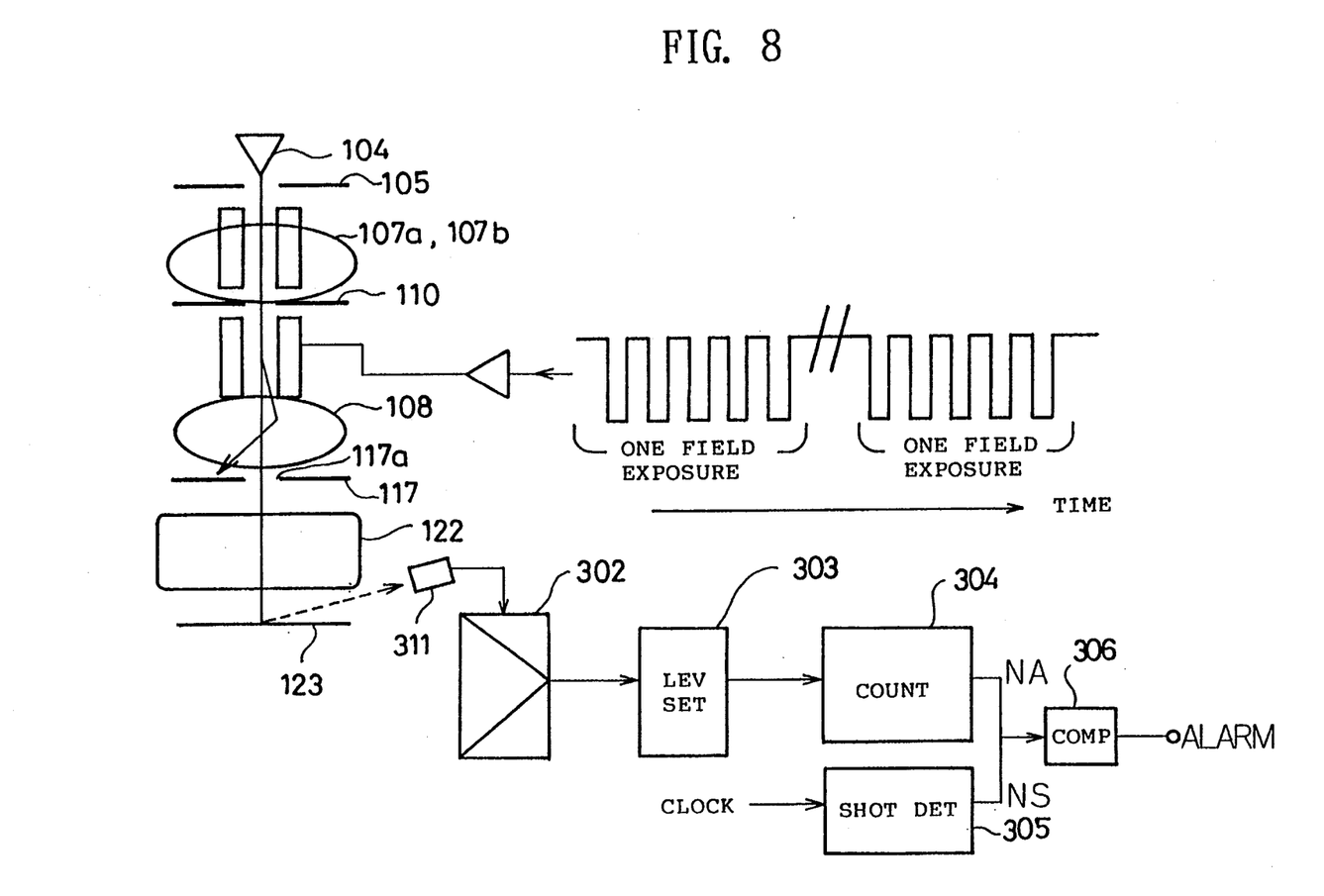
FIG. 8 is a diagram showing the construction of an electron beam exposure system according to a second embodiment of the present invention.

Referring to FIG. 8, an electron beam exposure system uses a high speed detector 311 for detecting low energy charge particles such as reflected electrons, secondary electrons, etc., that are emitted from a substrate when the substrate 123 is irradiated with the electron beam. A photomultiplier having a response speed of, for example, several nano-seconds, can be appropriately used as the detector 311, and such a detector can detect the actual electron beam reaching the substrate in accordance with the turning on and turning off of the electron at the round aperture plate 117 with a sufficient response speed. In this case, too, the output of the detector 311 is amplified by the amplifier 302 and is detected in terms of the threshold value by the threshold value detecting circuit 303. The output pulse signals of the detector 303 are counted by the counter 304, and the count result NA is compared by the comparator 306 with the total number NS of the clock pulses counted by the counter 305. In the same way as in the first embodiment, the comparator 306 outputs the alarm signal when a difference is detected between the count result NA and the count result NS.

Further, the present invention is by no means limited to the embodiments described heretofore, but various variations and modifications may be made without departing from the scope of the invention.

What is claimed is:

1. An electron beam exposure system comprising:
    an electron beam source for emitting an electron beam and directing the same to an object to be exposed along a predetermined optical axis;
    converging means for converging the electron beam on the object;
    deflecting means for deflecting the electron beam with respect to the optical axis for causing a scanning of the electron beam over the object;
    an electron beam shaping mask disposed between the electron beam source and the object on the optical axis, said electron beam shaping mask having a plurality of apertures for shaping the electron beam by a plurality of the apertures and forming a shaped electron beam corresponding to one of exposure patterns of which image is to be formed on the object;
    a blanking plate disposed between the electron beam shaping mask and the object on the optical axis, said blanking plate having an electron beam path formed in alignment with the optical axis for inhibiting the passage of the electron beam deviated from the optical axis;
    an electrostatic deflector disposed between the blanking plate and the electron beam source along the optical axis so as to deflect the electron beam from the optical axis according to driving pulse signals applied thereto;
    current adding means supplied with a first current induced in the electron beam shaping mask as a result of capturing of the electron beam by the electron beam shaping mask and a second current induced in the blanking plate as a result of capturing of the electron beam by the blanking plate, for generating a third current whose value is a sum of the first and second currents;

current/voltage converting means for generating a first pulse signal in response to the third current outputted from the current addition means;

first counting means supplied with the first pulse signals from the current-voltage converting means, for counting the first pulse signals and outputting a first count value representing the result of counting;

second counting means supplied with a second pulse signal corresponding to the driving signal, for counting the second pulse signals and generating a second count value representing the count result; and comparing means supplied with the first and second count values, for comparing the first count value with the second count value, said comparing means issuing an alarm indicating the failure of exposure on the basis of the result of comparison.

2. An electron beam exposure system according to claim 1, wherein said total current detecting means comprises current/voltage converting means for generating an output voltage signal on the basis of said third current, and threshold value detecting means supplied with said output voltage signal from said current/voltage converting means for comparing the same with a threshold voltage, said threshold voltage detecting means generating said first pulse signal.

3. An electron beam exposure system according to claim 2, wherein said threshold voltage detecting means sets said threshold voltage using a high level state of said first pulse signal as a reference, said threshold voltage detecting means detecting only those pulses of which levels are lower than said threshold voltage among said first pulse signals.

4. An electron beam exposure system according to claim 1, wherein said driving pulse signal and said second pulse signal have the same frequency.

5. An electron beam exposure system according to claim 4, wherein said driving signal and said second pulse signal are the same signal.

6. An electron beam exposure method comprising the steps of:

shaping an electron beam in conformity with a desired pattern by passing the electron beam through a mask;

repeatedly turning on and off the shaped electron beam by passing said electron beam through a cut-off plate having apertures; and exposing a pattern on an object to be exposed while the electron beam is turned on;

determining the sum of a first current generated in the cut-off plate while the electron beam is cut off by the cut-off plate and a second current generated in the mask when the electron beam is shaped by the mask;

producing an output signal representing a sum of said first and second currents respectively in correspondence to a state wherein the electron beam is turned on and a state wherein the electron beam is turned off;

producing an output pulse when the output signal for a state in which the electron beam is turned on, has a level lower than, by a predetermined threshold, the output signal for a state wherein the electron beam is turned off;

counting the output pulses; and issuing an alarm by detecting a discrepancy between a count value of the output pulses and the number of times of actual exposures.

7. A method as claimed in claim 6, wherein said step of producing the output pulse comprises the step of comparing said output signal with respect to a high level state of said output signal, said predetermined threshold being defined with respect to said high level state.

8. A method as claimed in claim 6, wherein said step of repeatedly turning on and turning off the shaped electron beam is achieved in synchronization with system clock pulses, and wherein said step of issuing alarm comprises a step of counting the number of said system clock pulses as said number of times of actual exposure.

* * * * *